United States Patent
Yang et al.

(10) Patent No.: US 12,321,097 B2
(45) Date of Patent: Jun. 3, 2025

(54) METHOD OF REMOVING PHOTORESIST, LAMINATE, METHOD OF FORMING METALLIC PATTERN, POLYIMIDE RESIN AND STRIPPER

(71) Applicant: eChem Solutions Corp., Taoyuan (TW)

(72) Inventors: Tz-Jin Yang, Taoyuan (TW); Yung-Yu Lin, Taoyuan (TW); Chi-Yu Lai, Taoyuan (TW); Ming-Che Chung, Taoyuan (TW); Che-Wei Chang, Taoyuan (TW)

(73) Assignee: eChem Solutions Corp., Taoyuan (TW)

( * ) Notice: Subject to any disclaimer, the term of this patent is extended or adjusted under 35 U.S.C. 154(b) by 442 days.

(21) Appl. No.: 17/141,228

(22) Filed: Jan. 5, 2021

(65) Prior Publication Data
US 2021/0223699 A1    Jul. 22, 2021

(30) Foreign Application Priority Data
Jan. 21, 2020    (TW) .................................. 109102100

(51) Int. Cl.
*G03F 7/11* (2006.01)
*C08G 69/26* (2006.01)
(Continued)

(52) U.S. Cl.
CPC ............. *G03F 7/11* (2013.01); *C08G 69/26* (2013.01); *C08G 69/265* (2013.01); *C08G 73/10* (2013.01);
(Continued)

(58) Field of Classification Search
CPC .. C08G 73/10; C08G 73/1039; C08G 73/106; C08G 69/26; C08G 69/265; G03F 7/092;
(Continued)

(56) References Cited

U.S. PATENT DOCUMENTS

| | | | |
|---|---|---|---|
| 5,426,071 | A | 6/1995 | Summers |
| 6,303,260 | B1 | 10/2001 | Hurditch et al. |

(Continued)

FOREIGN PATENT DOCUMENTS

| | | |
|---|---|---|
| CN | 101776847 | 7/2010 |
| CN | 103064248 | 4/2013 |

(Continued)

OTHER PUBLICATIONS

"Office Action of Taiwan Counterpart Application", issued on Aug. 14, 2020, p. 1-p. 8.

(Continued)

*Primary Examiner* — John S. Chu
(74) *Attorney, Agent, or Firm* — JCIPRNET

(57) ABSTRACT

A method of removing a photoresist, a laminate, a method of forming a metallic pattern, a polyimide resin, and a stripper are provided. The method of removing the photoresist includes forming a release layer on a substrate, the release layer having a first surface and a second surface opposite to each other, wherein the first surface of the release layer is in contact with the substrate; forming a photoresist layer on the second surface of the release layer; and removing the release layer and the photoresist layer. The release layer is formed by a polyimide resin. The polyimide resin is obtained by performing a polymerization of tetracarboxylic dianhydrides, diamines, and phenolamines. The diamines include hydroxyfluorinated diamines, benzoic acid diamines, and aminotetramethyldisiloxanes.

19 Claims, 4 Drawing Sheets

(51) Int. Cl.
- *C08G 73/10* (2006.01)
- *C08G 73/26* (2006.01)
- *G03F 7/00* (2006.01)
- *G03F 7/037* (2006.01)
- *G03F 7/038* (2006.01)
- *G03F 7/039* (2006.01)
- *G03F 7/30* (2006.01)
- *G03F 7/34* (2006.01)
- *G03F 7/42* (2006.01)

(52) U.S. Cl.
CPC ............ *G03F 7/0002* (2013.01); *G03F 7/037* (2013.01); *G03F 7/0382* (2013.01); *G03F 7/30* (2013.01); *G03F 7/343* (2013.01); *G03F 7/42* (2013.01)

(58) Field of Classification Search
CPC ..... G03F 7/11; G03F 7/30; G03F 7/42; G03F 7/422
See application file for complete search history.

(56) References Cited

U.S. PATENT DOCUMENTS

| | | |
|---|---|---|
| 6,800,426 B2 | 10/2004 | Ray et al. |
| 8,257,901 B2 | 9/2012 | Kim et al. |
| 9,076,658 B1 | 7/2015 | Brown et al. |
| 2004/0053156 A1* | 3/2004 | Fujita .................... G03F 7/0048 430/326 |
| 2009/0075198 A1 | 3/2009 | Nomura |
| 2015/0132591 A1* | 5/2015 | Oishi ........................ C08J 5/18 428/458 |
| 2019/0263968 A1 | 8/2019 | Fujihara et al. |

FOREIGN PATENT DOCUMENTS

| | | | |
|---|---|---|---|
| CN | 104662097 | 5/2015 | |
| CN | 106547177 | 3/2017 | |
| JP | 20160161894 | * 9/2016 | ............ G03F 7/023 |
| KR | 20150087642 | 7/2015 | |
| TW | I294559 | 3/2008 | |
| TW | I417318 | 12/2013 | |
| TW | 201703593 | 1/2017 | |
| TW | M538683 | 3/2017 | |
| TW | 201821280 | 6/2018 | |
| TW | I662063 | 6/2019 | |

OTHER PUBLICATIONS

"Office Action of Taiwan Counterpart Application", issued on Mar. 16, 2021, p. 1-p. 5.
"Office Action of China Counterpart Application", issued on Jan. 25, 2024, p. 1-p. 7.

* cited by examiner

METHOD OF REMOVING PHOTORESIST, LAMINATE, METHOD OF FORMING METALLIC PATTERN, POLYIMIDE RESIN AND STRIPPER

CROSS-REFERENCE TO RELATED APPLICATION

This application claims the priority benefit of Taiwan application serial no. 109102100, filed on Jan. 21, 2020. The entirety of the above-mentioned patent application is hereby incorporated by reference herein and made a part of this specification.

BACKGROUND OF THE INVENTION

Field of the Invention

The invention relates to a method of removing a photoresist, and in particular to a method of removing a photoresist including a laminate of a film formed by a polyimide resin, a method of forming a metallic pattern, and a stripper used in the method.

Description of Related Art

Polyimide (PI) is a thermosetting polymer formed by the polymerization of dianhydrides and diamines and has excellent thermal stability, chemical resistance, mechanical properties, and electrical properties, and is therefore commonly used as a molding material, electronic material, optical material, etc., and is widely used in various fields. Polyimide may also be used in the process of forming a metallic pattern. However, a thin film formed by polyimide has the issue that the thin film is not readily dissolved in a solvent after a high-temperature process. For example, in the process of forming a metallic pattern, lift-off is often used to form such metallic pattern. When a thin film formed by polyimide is not readily dissolved in a stripper, the photoresist used to form the metallic pattern may not be readily peeled and may remain in a device using the thin film, thereby affecting the performance of the device.

SUMMARY OF THE INVENTION

Accordingly, this disclosure provides a polyimide resin having good stripping properties, a method of removing a photoresist, a laminate, a method of forming a metallic pattern, and a stripper.

A method of removing a photoresist of the invention includes the following steps. A release layer is formed on a substrate, the release layer having a first surface and a second surface opposite to each other, wherein the first surface of the release layer is in contact with the substrate. A photoresist layer is formed on the second surface of the release layer. The release layer and the photoresist layer are removed. The release layer is formed by a polyimide resin. The polyimide resin is obtained by performing a polymerization of tetracarboxylic dianhydrides, diamines, and phenolamines. The diamines include hydroxyfluorinated diamines, benzoic acid diamines, and aminotetramethyldisiloxanes.

In an embodiment of the invention, the diamines further include phenyl ether diamines.

In an embodiment of the invention, a stripper for removing the release layer and the photoresist layer is a mixture of ethylene glycol and diethylene glycol monobutyl ether.

In an embodiment of the invention, the polyimide resin has a structure represented by formula (1):

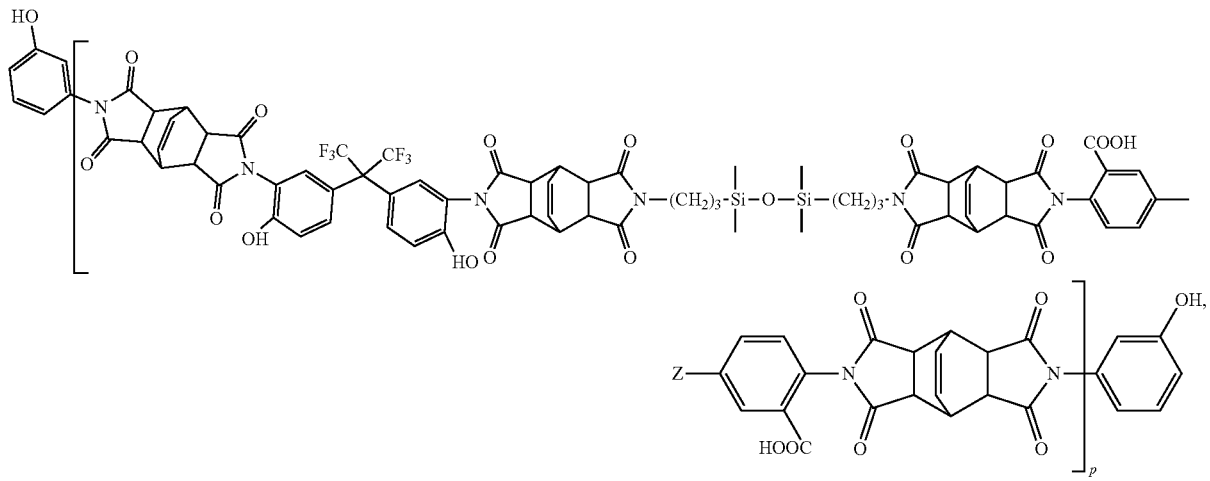

Formula (1)

in Formula (1), p is an integer of 2 to 30, and Z is an alkylene group.

In an embodiment of the invention, Z is a methylene group ($-CH_2-$).

In an embodiment of the invention, the photoresist layer is a negative photoresist layer.

A laminate of the invention includes a substrate, a release layer, and a photoresist layer. The release layer has a first surface and a second surface opposite to each other. The first surface of the release layer is in contact with the substrate. The photoresist layer has a third surface and a fourth surface opposite to each other. The third surface of the photoresist layer is in contact with the second surface of the release layer. There is a spacing between an edge of the third surface of the photoresist layer and an edge of the second surface of the release layer.

In an embodiment of the invention, the spacing is 1 μm to 35 μm.

In an embodiment of the invention, a cross-section of the photoresist layer along a direction of lamination of the substrate, the release layer, and the photoresist layer is an inverted cone.

In an embodiment of the invention, a thickness of the release layer is 0.1 μm to 10 μm.

In an embodiment of the invention, the release layer is formed by a polyimide resin. The polyimide resin is obtained by performing a polymerization of tetracarboxylic dianhydrides, diamines, and phenolamines. The diamines include hydroxyfluorinated diamines, benzoic acid diamines, and aminotetramethyldisiloxanes.

In an embodiment of the invention, the diamines further include phenyl ether diamines.

In an embodiment of the invention, the release layer is formed by a polyimide resin. The polyimide resin has a structure represented by Formula (2) or a structure represented by Formula (3),

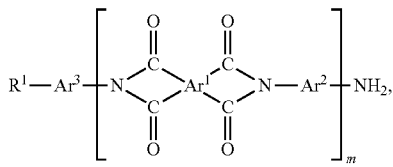

Formula (2)

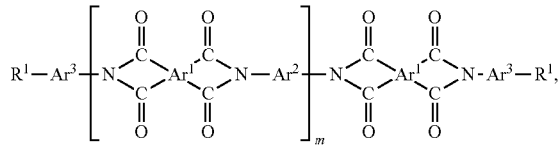

Formula (3)

in Formula (2) and Formula (3), m is an integer of 5 to 150, n is an integer of 5 to 150, $Ar^1$ is a tetravalent organic group, $Ar^2$ is a divalent organic group, $Ar^3$ is a divalent aryl group, and $R^1$ is a hydroxyl group or a carboxyl group.

In an embodiment of the invention, $Ar^1$ is

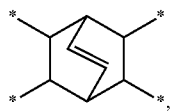

and * represents a bonding position.

In an embodiment of the invention, $Ar^2$ is

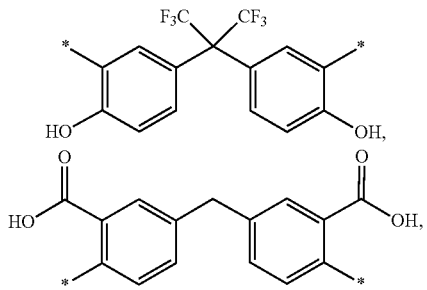

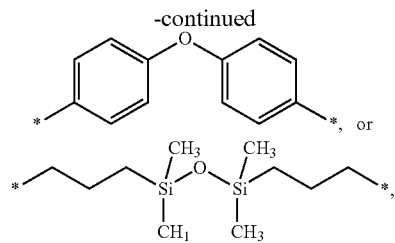

and * represents a bonding position.

In an embodiment of the invention, $Ar^3$ is a phenylene group.

In an embodiment of the invention, a weight-average molecular weight of the polyimide resin is 5000 to 50000.

In an embodiment of the invention, the photoresist layer is a negative photoresist layer.

A method of forming a metallic pattern of the invention includes the following steps. A release layer is formed on a substrate. A photoresist layer is formed on the release layer. An exposure and development process is performed on the release layer and the photoresist layer to form a composite photoresist on the substrate. A metal layer is formed on the composite photoresist and a portion of the substrate exposed by the composite photoresist. The composite photoresist and a portion of the metal layer located on the composite photoresist are removed to form a metallic pattern on the substrate. The release layer is formed by a polyimide resin. The polyimide resin is obtained by performing a polymerization of tetracarboxylic dianhydrides, diamines, and phenolamines. The diamines include hydroxyfluorinated diamines, benzoic acid diamines, and aminotetramethyldisiloxanes.

In an embodiment of the invention, the diamines further include phenyl ether diamines.

In an embodiment of the invention, a stripper for removing the composite photoresist is a mixture of ethylene glycol and diethylene glycol monobutyl ether.

In an embodiment of the invention, the photoresist layer is a negative photoresist layer.

A polyimide resin of the invention is obtained by performing a polymerization of tetracarboxylic dianhydrides, diamines, and phenolamines. The diamines include hydroxyfluorinated diamines, benzoic acid diamines, and aminotetramethyldisiloxanes.

In an embodiment of the invention, the diamines further include phenyl ether diamines.

A polyimide resin of the invention has a structure represented by Formula (2) or a structure represented by Formula (3),

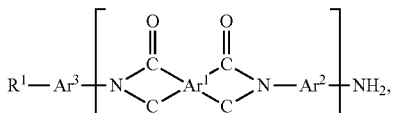

Formula (2)

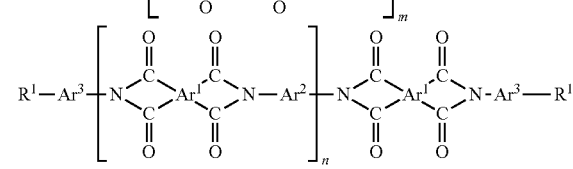

in Formula (2) and Formula (3), m is an integer of 5 to 150, n is an integer of 5 to 150, $Ar^1$ is a tetravalent organic group, $Ar^2$ is a divalent organic group, $Ar^3$ is a divalent aryl group, and $R^1$ is a hydroxyl group or a carboxyl group.

In an embodiment of the invention, $Ar^1$ is

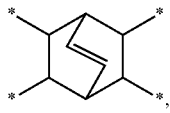

and * represents a bonding position.

In an embodiment of the invention, $Ar^2$ is

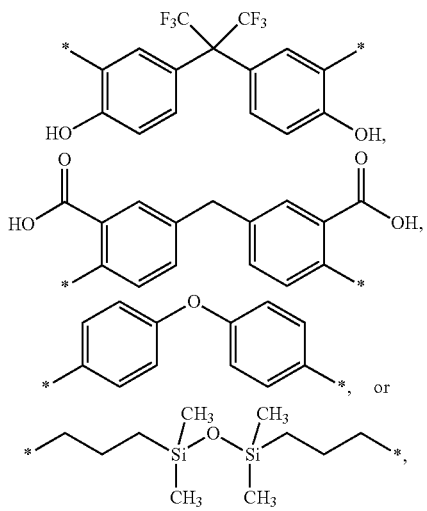

and * represents a bonding position.

In an embodiment of the invention, $Ar^3$ is a phenylene group.

In an embodiment of the invention, a weight-average molecular weight of the polyimide resin is 5000 to 50000.

A stripper of the invention is used in the method of removing the photoresist or the method of forming the metallic pattern. The stripper is a mixture of ethylene glycol and diethylene glycol monobutyl ether.

Based on the above, in the method of removing the photoresist of the invention, the photoresist layer is formed on the release layer and in contact with the release layer, wherein the release layer is formed by a polyimide resin, and the polyimide resin is obtained by performing a polymerization of tetracarboxylic dianhydrides, diamines, and phenolamines, wherein the diamines include hydroxyfluorinated diamines, benzoic acid diamines, and aminotetramethyldisiloxanes. Thereby, a structure including the release layer may have good stripping properties, and the photoresist layer may be removed well. In addition, the composite photoresist may also be removed well in the method of forming the metallic pattern. In addition, the stripper of the invention is a mixture of ethylene glycol and diethylene glycol monobutyl ether, and may be applied to the method of removing the photoresist or the method of forming the metallic pattern to remove the photoresist layer or the composite photoresist well.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
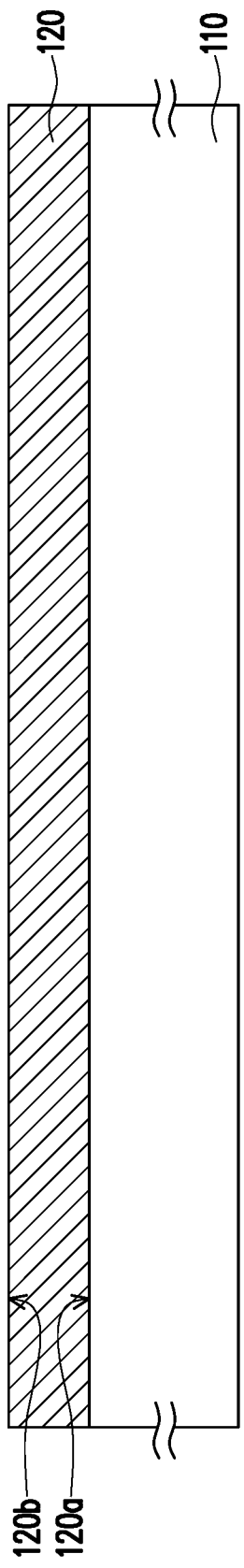
FIG. 1A to FIG. 1C are diagrams of a manufacturing process of a laminate according to an embodiment of the invention.

The invention provides a laminate including a release layer formed by a polyimide resin and a photoresist layer. In addition, a method of removing a photoresist and a method of forming a metallic pattern are also provided. Hereinafter, the polyimide resin, the laminate, the method of removing the photoresist, and the method of forming the metallic pattern are described in detail.

It is explained here that the "tetravalent organic group" as used in the specification is a substituent derived from an organic compound, which is derived from a group formed by removing four hydrogen atoms from an atom of an organic compound. Thereby, four chemical bonds may be formed with other atoms.

The "divalent organic group" as used in the specification is a substituent derived from an organic compound, which is derived from a group formed by removing two hydrogen atoms from an atom of an organic compound. Thereby, two chemical bonds may be formed with other atoms.

As used in the specification, the "divalent aryl group" is a substituent derived from an aromatic monocyclic or polycyclic hydrocarbon ring system and is a group formed by removing two hydrogen atoms from a carbon atom on an aromatic monocyclic or polycyclic ring. Thereby, two chemical bonds may be formed with other atoms.

<Polyimide Resin>

The polyimide resin according to the present embodiment is obtained by performing a polymerization of tetracarboxylic dianhydrides, diamines, and phenolamines. Hereinafter, the various monomers above are described in detail.

Tetracarboxylic Dianhydrides

The tetracarboxylic dianhydrides are not particularly limited, and a suitable tetracarboxylic dianhydride compound may be selected as needed.

For example, the tetracarboxylic dianhydrides may include bicyclo[2.2.2]oct-7-ene-2,3,5,6-tetracarboxylic dianhydride, 1,2,4,5-cyclohexanetetracarboxylic dianhydride, 4,4'-diphenyl ether tetraanhydride, 5-(2,5-dioxotetrahydrofuran)-3-methyl-3-cyclohexene-1,2-dicarbonic anhydride, 3,3',4,4'-benzophenonetetracarboxylic dianhydride, 2,3,3',4'-diphenyl ether tetracarboxylic dianhydride, 1,2,3,4-cyclobutane tetracarboxylic dianhydride, or other suitable tetracarboxylic dianhydride compounds, preferably including bicyclic[2.2.2]oct-7-ene-2,3,5,6-tetracarboxylic dianhydride. As the tetracarboxylic dianhydrides, one tetracarboxylic dianhydride compound may be used alone, or a plurality of tetracarboxylic dianhydride compounds may be used in combination.

Diamines

The diamines include hydroxyfluorinated diamines, benzoic acid diamines, and aminotetramethyldisiloxanes.

For example, the hydroxyfluorinated diamines may include 2,2-bis(3-amino-4-hydroxyphenyl)hexafluoropropane, 2,2-bis(3-amino-3-hydroxyphenyl)hexafluoropropane, 2,2-bis(4-amino-4-hydroxyphenyl)hexafluoropropane, or other suitable hydroxyfluorinated diamine compounds, preferably including 2,2-bis(3-amino-4-hydroxyphenyl)hexafluoropropane. As the hydroxyfluorinated diamines, one hydroxyfluorinated diamine compound may be used alone, or a plurality of hydroxyfluorinated diamine compounds may be used in combination.

The benzoic acid diamines may include bis(4-amino-3-carboxyphenyl)methane, bis(3-amino-3-carboxyphenyl)methane, bis(4-amino-4-carboxyphenyl)methane, or other suitable benzoic acid diamine compounds, preferably including bis(4-amino-3-carboxyphenyl)methane. As the benzoic acid diamines, one benzoic acid diamine compound may be used alone, or a plurality of benzoic acid diamine compounds may be used in combination.

The aminotetramethyldisiloxanes may include 1,3-bis(3-aminopropyl)tetramethyldisiloxane, or other suitable aminotetramethyldisiloxane compounds, preferably including 1,3-bis(3-aminepropyl)tetramethyldisiloxane. As the aminotetramethyldisiloxanes, one aminotetramethyldisiloxane compound may be used alone, or a plurality of aminotetramethyldisiloxane compounds may be used in combination.

In other embodiments, the diamines may further include phenyl ether diamines. In addition, in other embodiments, the diamines may further include other suitable diamine compounds.

The phenyl ether diamines may include 4,4'-diaminodiphenyl ether, 2,2-bis[4-(4-aminophenoxy)phenyl]hexafluoropropane, 2,2-bis[4-(4-aminophenoxy)phenyl]propane, bis[4-(3-aminophenoxy)phenyl]sulfone, 3,4'-diaminodiphenyl ether, 3,3'-diaminodiphenyl ether, or other suitable phenyl ether diamine compounds, preferably including 4,4'-diaminodiphenyl ether. As the phenyl ether diamines, one phenyl ether diamine compound may be used alone, or a plurality of phenyl ether diamine compounds may be used in combination.

When the diamines in the polyimide resin include hydroxyfluorinated diamines, benzoic acid diamines, and aminotetramethyldisiloxanes, the structure including the resulting release layer has good stripping properties such that the photoresist layer or the composite photoresist may be removed well when the photoresist is removed or a metallic pattern is formed.

Phenolamines

In the present embodiment, the phenolamines are used as a capping agent. The phenolamines are not particularly limited, and a suitable phenolamine compound may be selected as needed.

For example, the phenolamines may include any suitable phenolamine compound, preferably 3-aminophenol. As the phenolamines, one phenolamine compound may be used alone, or a plurality of phenolamine compounds may be used in combination.

<Preparation of Polyimide Resin>

The tetracarboxylic dianhydrides, hydroxyfluorinated diamines, benzoic acid diamines, and aminotetramethyldisiloxanes may be polymerized first to form a polyamic acid polymer. Next, the phenolamines were added, and a dehydration closed-loop reaction was performed, such that the amic acid functional group in the polyamic acid polymer was converted into an imide group (that is, imidization) via a dehydration closed-loop reaction to obtain a polyimide resin including an imide functional group and a structure having a phenol group at a terminal.

The polymerization reaction and dehydration closed-loop reaction may be performed in the presence of a solvent. The solvent may include γ-butyrolactone (GBL), N-methylpyrrolidone, dimethylacetamide, methylformamide, or a combination thereof, and preferably includes a solvent with lower solubility for polyimide resin, such as GBL. For example, when using a polar solvent containing a nitrogen atom, such as N-methylpyrrolidone, the polyimide resin dissolved in the solvent may produce a whitening phenomenon due to hygroscopicity, resulting in poor stability of the polyimide resin. Therefore, the toughness and electrical characteristics of a film formed by the polyimide resin are reduced. However, the invention is not limited thereto, and other solvents may be selected as needed. Based on a usage amount of 100 wt % of the GBL, the usage amount of the solvent in the polymerization reaction may be 15 wt % to 80 wt %, preferably 30 wt % to 75 wt %.

The temperature of the polymerization may be 50° C. to 80° C. and the time may be 3 hours to 6 hours.

The dehydration closed-loop reaction may be performed using a high-temperature dehydration closed-loop method or a chemical dehydration closed-loop method. The temperature of the high-temperature dehydration closed-loop method may be 250° C. to 350° C., and the time may be 3 hours to 6 hours. In the chemical dehydration closed-loop method, a dehydrating agent and a catalyst may be added to the reaction solution and reacted at a temperature of 160° C. to 180° C. for 3 hours to 6 hours. The dehydrating agent is, for example, an acid anhydride such as acetic anhydride, propionic anhydride, or trifluoroacetic anhydride, but the invention is not limited thereto, and other dehydrating agents may be selected as needed. The catalyst is, for example, a tertiary amine such as triethylamine, pyridine, or dimethylpyridine, but the invention is not limited thereto, and other catalysts may be selected as needed.

For example, when a chemical dehydration closed-loop method is used, bicyclo[2.2.2]oct-7-ene-2,3,5,6-tetracarboxylic dianhydride used as the tetracarboxylic dianhydrides, 2,2-bis(3-amino-4-hydroxyphenyl)hexafluoropropane used as the hydroxyfluorinated diamines, bis(4-amino-3-carboxyphenyl)methane used as the benzoic acid diamines, 1,3-bis(3-aminopropyl)tetramethyldisiloxane used as the aminotetramethyldisiloxanes, and 3-aminophenol used as the phenolamines are reacted to form a polyimide resin including an imide functional group and a structure having a phenol group at a terminal. For example, the structure represented by Formula (1) may be formed.

Formula (1)

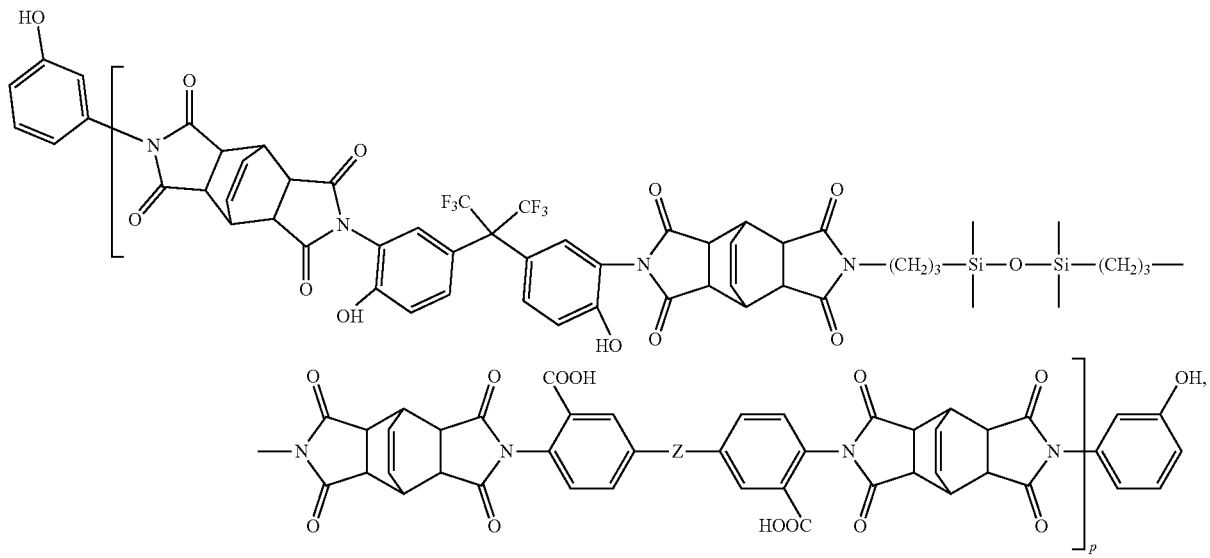

in Formula (1), p is an integer of 2 to 30, and Z is an alkylene group.

The alkylene group represented by Z may be derived from the benzoic acid diamines. In an embodiment, Z may be a C1 to C10 alkylene group. In an embodiment, Z is preferably a methylene group.

Specifically, the polyimide resin has a structure represented by Formula (2) or a structure represented by Formula (3). Next, the structures represented by Formula (2) and Formula (3) are described in detail.

Formula (2)

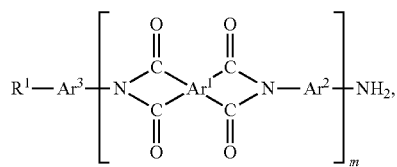

In Formula (2), m is an integer of 5 to 150, $Ar^1$ is a tetravalent organic group, $Ar^2$ is a divalent organic group, $Ar^3$ is a divalent aryl group, and $R^1$ is a hydroxyl group or a carboxyl group.

More specifically, the tetravalent organic group represented by $Ar^1$ may be derived from the tetracarboxylic dianhydride compound. In an embodiment, $Ar^1$ is preferably

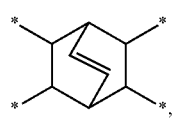

and * represents a bonding position.

The divalent organic group represented by $Ar^2$ may be derived from the diamines. The divalent organic group represented by $Ar^2$ may be derived from the hydroxyfluorinated diamines, benzoic acid diamines, aminotetramethyldisiloxanes, or phenyl ether diamines. In an embodiment, $Ar^2$ is preferably

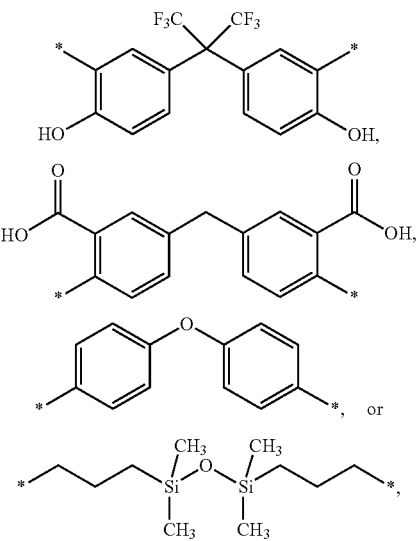

and * represents a bonding position. In an embodiment, $Ar^2$ is more preferably

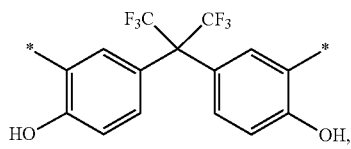

-continued

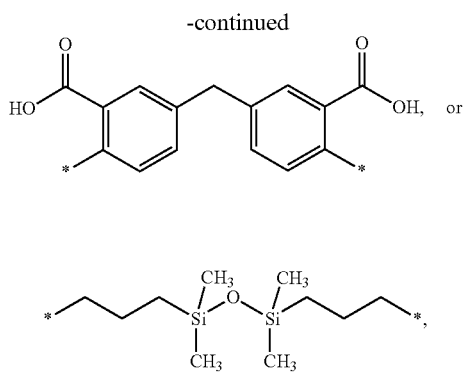

and * represents a bonding position.

The divalent aryl group represented by $Ar^3$ may be derived from the phenolamines. In an embodiment, $Ar^3$ is preferably a phenylene group.

The hydroxyl group represented by $R^1$ may be derived from the phenolamines. The carboxyl group represented by $R^1$ may be derived from aminobenzoic acids. In an embodiment, $R^1$ is preferably a hydroxyl group.

m is preferably an integer of 5 to 100, and more preferably an integer of 5 to 50.

Formula (3)

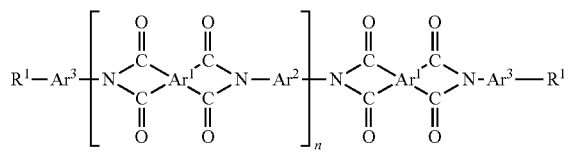

In Formula (3), n is an integer of 5 to 150, and the groups represented by $Ar^1$, $Ar^2$, $Ar^3$, and $R^1$ are the same as the groups represented by $Ar^1$, $Ar^2$, $Ar^3$, and $R^1$ in Formula (2) and are not repeated herein.

n is preferably an integer of 5 to 100, and more preferably an integer of 5 to 50.

The weight-average molecular weight of the polyimide resin is 5000 to 50000, preferably 10000 to 40000, and more preferably 25000 to 35000. When the weight-average molecular weight of the polyimide resin is 5000 to 50000, the release layer formed by the polyimide resin has different spacings and thicknesses, such that an ideal material shape with vapor deposition or sputtering is obtained.

<Method of Removing Photoresist>

Figure 1B:
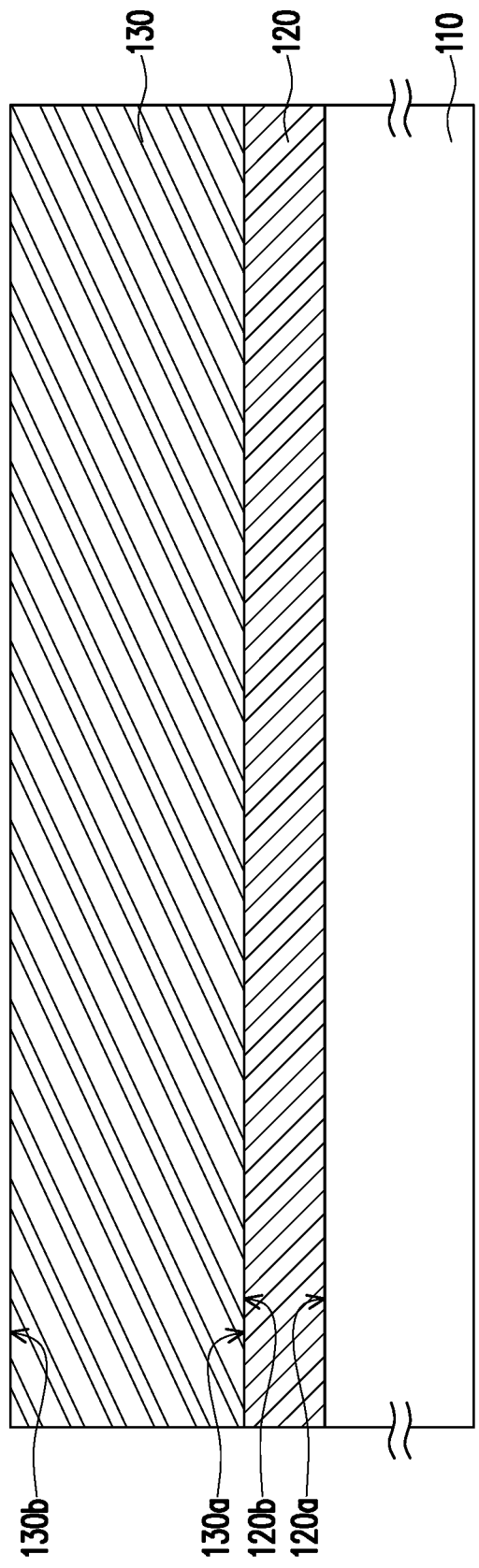
Figure 1C:
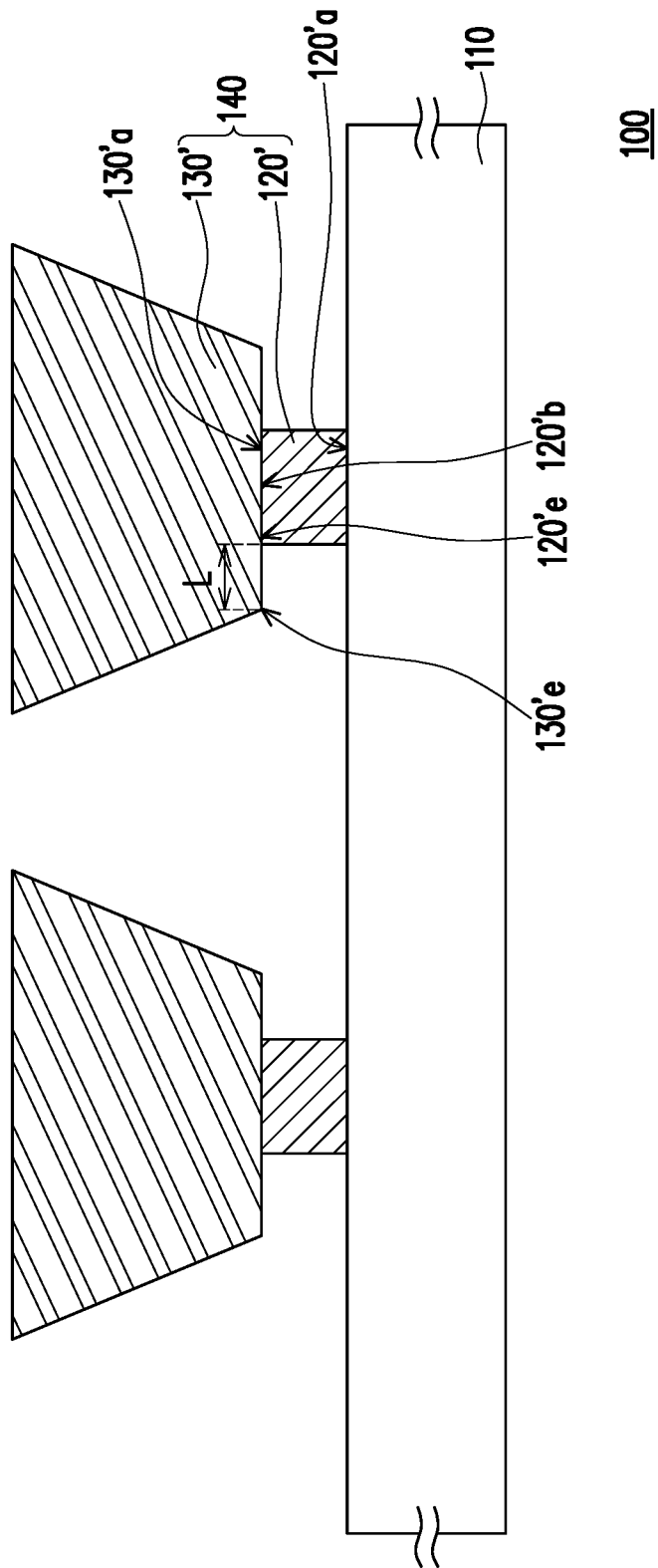

A method of removing the photoresist includes forming a laminate. FIG. 1A to FIG. 1C are diagrams of a manufacturing process of a laminate according to an embodiment of the invention. A laminate 100 includes a substrate 110, a release layer 120', and a photoresist layer 130'.

Referring to FIG. 1A, a substrate 110 is provided, and a release layer 120 is formed on the substrate 110. The substrate 110 may be a glass substrate, a silicon wafer substrate, or a plastic base material (such as a polyether sulfone (PES) board or a polycarbonate (PC) board), and the type thereof is not particularly limited.

The release layer 120 has a first surface 120a and a second surface 120b opposite to each other. The first surface 120a of the release layer 120 is in contact with the substrate 110. The release layer 120 is formed by a polyimide resin. In the present embodiment, the release layer 120 may be used with the substrate 110 to form a laminate, but the invention is not limited thereto. In other embodiments, the release layer may be used alone as the release layer. In the present embodiment, the thickness of the release layer may be about 0.1 μm to 10 μm, preferably about 1 μm to 10 μm, but the invention is not limited thereto. The release layer may be formed by coating a solution formed by the polyimide resin on a substrate to form a coating film, and soft-baking the coating film. For example, after coating a solution formed by the polyimide resin on a substrate to form a coating film, a soft-baking step is performed at a temperature of 160° C. to 220° C. for 2 minutes to form a release layer on the substrate.

Referring to FIG. 1B, a photoresist layer 130 is formed on the second surface 120b of the release layer 120. The photoresist layer 130 has a third surface 130a and a fourth surface 130b opposite to each other. The third surface 130a of the photoresist layer 130 is in contact with the second surface 120b of the release layer 120. In the present embodiment, the thickness of the photoresist layer may be about 0.5 μm to 20 μm, but the invention is not limited thereto. In the present embodiment, the photoresist layer may be a negative photoresist layer. The photoresist layer may be formed by coating the photoresist on a substrate to form a coating film, and soft-baking the coating film. For example, after the photoresist is coated on the substrate to form a coating film, a soft-baking step is performed at a temperature of 90° C. to 130° C. for 2 minutes to form a photoresist layer on the release layer.

The coating method is not particularly limited, but a spray coating method, a roll coating method, a spin coating method, or the like may be used, and in general, a spin coating method is widely used. In addition, a coating film is formed, and then, in some cases, the residual solvent may be partially removed under reduced pressure.

Referring to FIG. 1C, an exposure and development process may be performed on the release layer 120 and the photoresist layer 130 to form a patterned release layer 120' and photoresist layer 130' on the substrate 110. A composite photoresist 140 may include the release layer 120' and the photoresist layer 130'. The release layer 120' has a first surface 120'a in contact with the substrate 110 and a second surface 120'b opposite to the first surface 120'a. The photoresist layer 130' has a third surface 130'a in contact with the first surface 120'a. In the present embodiment, there may be a spacing L between an edge 130'e of the third surface 130'a of the photoresist layer 130' and an edge 120'e of the second surface 120'b of the release layer 120'. At this point, the laminate 100 is substantially completed. In the present embodiment, the spacing L may be about 1 μm to 35 μm, but the invention is not limited thereto. In the present embodiment, the cross-section of the photoresist layer 130' along the direction of lamination of the substrate 110, the release layer 120', and the photoresist layer 130' may be an inverted cone, but the invention is not limited thereto.

Next, the release layer 120' and the photoresist layer 130' are removed. In the present embodiment, the release layer 120' and the photoresist layer 130' may be removed by a lift-off method, but the invention is not limited thereto. In the lift-off method, the release layer 120' and the photoresist layer 130' are removed using a stripper. There is no particular limitation on the stripper, and a suitable stripper may be selected according to requirements; a mixture of ethylene glycol and diethylene glycol monobutyl ether is preferred.

<Method of Forming Metallic Pattern>

The method of forming a metallic pattern includes performing an exposure and development process on the release layer 120 and the photoresist layer 130 to form a composite photoresist 140 on the substrate 110 (as shown in FIG. 1B to FIG. 1C). For example, the release layer 120 and the photoresist layer 130 are exposed to light at 4000 J/m² for 0.05 minutes. Then, post-bake is performed at 90° C. to 130° C. for 120 seconds to 180 seconds. Next, development is performed with a developing solution for 13 seconds to 26 seconds, and hard-baking is performed at 220° C. for 20 minutes after development to form the composite photoresist 140 on the substrate 110. The developing solution is not particularly limited, and a suitable developing solution may be selected according to needs. For example, the developing solution may be tetramethyl ammonium hydroxide (TMAH), and the concentration thereof may be 2.38 wt %.

Figure 2A:
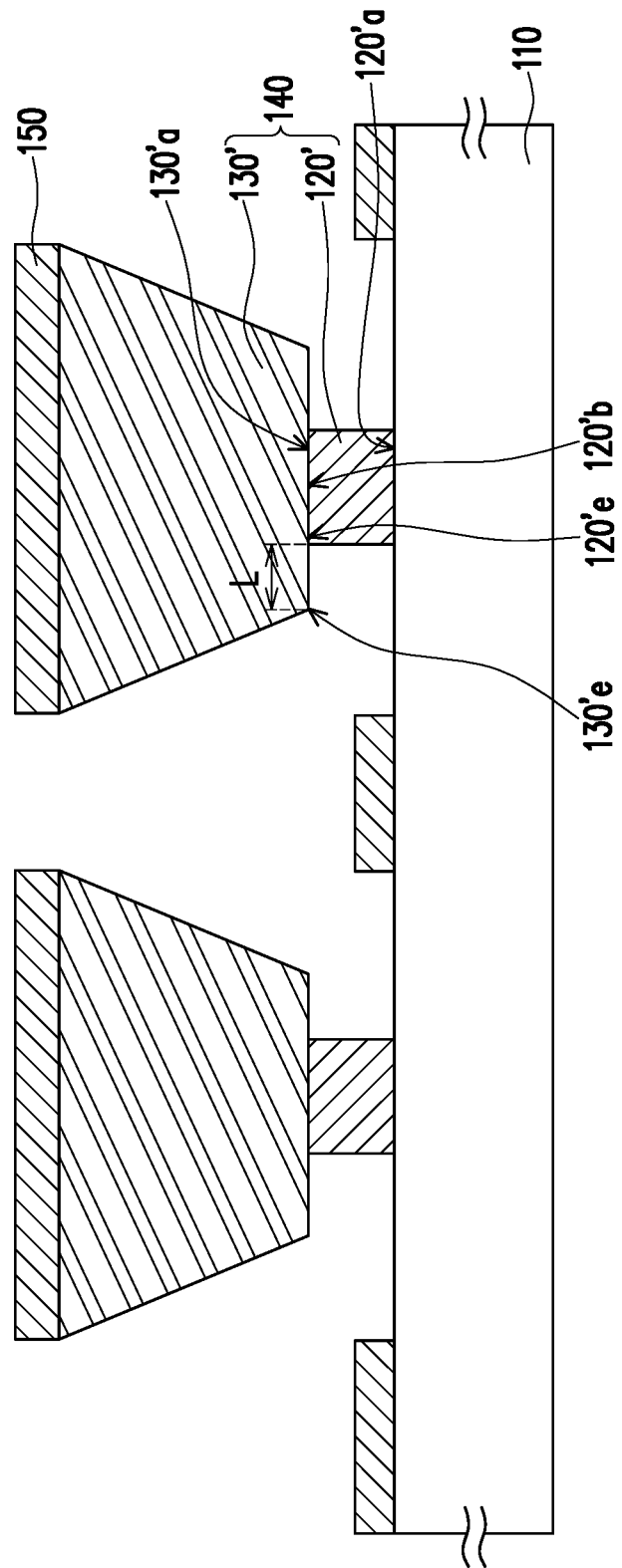
FIG. 2A to FIG. 2B are partial flow diagrams of a method of forming a metallic pattern according to an embodiment of the invention.

Next, referring to FIG. 2A, a metal layer 150 is formed on the composite photoresist 140 and a portion of the substrate 110 exposed by the composite photoresist 140. The material of the metal layer 150 may be a single- or multi-layer stacked metal material, such as at least one selected from the group consisting of copper (Cu), molybdenum (Mo), titanium (Ti), aluminum (Al), tungsten (W), silver (Ag), gold (Au), and an alloy thereof.

Figure 2B:
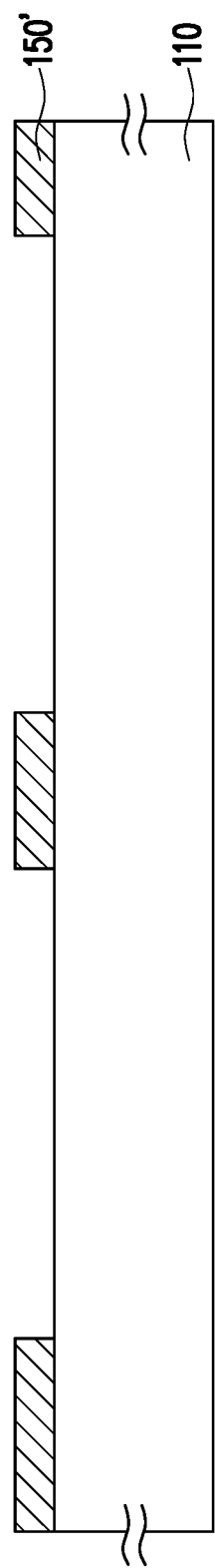

Referring to FIG. 2B, the composite photoresist 140 and a portion of the metal layer located on the composite photoresist 140 are removed to form a metallic pattern 150' on the substrate. In the present embodiment, the method of removing the composite photoresist 140 and a portion of the metal layer located on the composite photoresist 140 may be the same as the method of removing the photoresist, and is not repeated herein.

Hereinafter, the invention is described in detail with reference to examples. The following examples are provided to describe the invention, and the scope of the invention includes the scope of the following patent application and its substitutes and modifications, and is not limited to the scope of the examples.

Examples of Polyimide Resin and Laminate

Example 1 to Example 3 and Comparative example 1 to Comparative example 2 of the polyimide resin and the laminate are described below:

Example 1 a. Polyimide Resin 153.13 grams of bicyclo[2.2.2]oct-7-ene-2,3,5,6-tetracarboxylic dianhydride, 112.99 grams of 2,2-bis(3-amino-4-hydroxyphenyl)hexafluoropropane, 61.82 grams of bis(4-amino-3-carboxyphenyl)methane, and 15.33 grams of 1,3-bis(3-aminopropyl)tetramethyldisiloxane were added to a 1000-ml three-necked round-bottomed flask containing nitrogen, and then 647.20 g of γ-butyrolactone (GBL) was added, and stirring was performed at 70° C. for 4 hours. Then, 6.73 g of 3-aminophenol was further added, and stirring was further performed at 70° C. for 4 hours. Then, 2.80 g of 1-ethylpiperidine was further added, and the temperature was raised to 180° C. and stirring was performed for 4 hours. After cooling, a thick polyimide resin solution was obtained.

b. Laminate

Each polyimide resin solution obtained in the Examples was coated on a substrate via a spin-coating method (spin coater model: Clean Track MK-8, manufactured by Tokyo Electron Limited (TEL), rotating speed: 1200 rpm). Then, soft-baking was performed at a temperature of 220° C. for 2 minutes to form a release layer having a thickness of 2 μm. Then, a negative photoresist (trade name: SCN series photoresist, manufactured by eChem Solutions Corp., abbreviated as ECSC) was subjected to soft-baking on a baking sheet at 90° C. for 2 minutes via a spin coating method to form a negative photoresist layer having a thickness of 8 μm. Next, the release layer and the photoresist layer were exposed to light at 4000 J/m² for 0.05 minutes. Then, post-bake was performed for 2.5 minutes on a 100° C. baking sheet. Then, using TMAH having a concentration of 2.38 wt % as a developing solution, development was performed for 13 seconds, and after the development, hard-baking was performed at 220° C. for 20 minutes to form a composite photoresist on the substrate to obtain a laminate. The obtained laminate was evaluated by each of the following evaluation methods, and the results thereof are as shown in Table 1.

Example 2 to Example 3 and Comparative Example 1 to Comparative Example 2

The polyimide resins of Example 2 to Example 3 and Comparative example 1 to Comparative example 2 were prepared using the same steps as Example 1, and the difference thereof is: the type and the usage amount of the components of the polyimide resins were changed (as shown in Table 1). The release film made by the resulting polyimide resin was evaluated by the following evaluation methods, and the results thereof are shown in Table 1.

TABLE 1

| | | Examples | | |
|---|---|---|---|---|
| Component (unit: parts by mole) | | 1 | 2 | 3 |
| Resin type | | Polyimide resin | Polyimide resin | Polyimide resin |
| Tetracarboxylic dianhydrides | Bicyclo[2.2.2]oct-7-ene-2,3,5,6-tetracarboxylic dianhydride | 1 | 1 | 1 |
| Hydroxyfluorinated diamines | 2,2-bis(3-amino-4-hydroxyphenyl)hexafluoropropane | 0.5 | 0.5 | 0.5 |
| Benzoic acid diamines | Bis(4-amino-3-carboxyphenyl)methane | 0.35 | 0.225 | 0.175 |
| Phenyl ether diamines | 4,4'-diaminodiphenyl ether | — | 0.095 | 0.175 |
| Aminotetramethyldisiloxanes | 1,3-bis(3-aminopropyl)tetramethyldisiloxane | 0.1 | 0.1 | 0.1 |
| Phenolamines | 3-aminophenol | 0.1 | 0.1 | 0.1 |
| Evaluation results | Alkali dissolution rate (Å/s) | 2039 | 1845 | 1548 |
| | Spacing (μm) | 30.28 | 10.35 | 2.56 |

TABLE 1-continued

|  |  | Comparative examples | |
|---|---|---|---|
| Component (unit: parts by mole) |  | 1 | 2 |
| Resin type |  | Polyimide resin | Phenolic resin |
| Tetracarboxylic dianhydrides | Bicyclo[2.2.2]oct-7-ene-2,3,5,6-tetracarboxylic dianhydride | 1 | — |
| Hydroxyfluorinated diamines | 2,2-bis(3-amino-4-hydroxyphenyl)hexafluoropropane | 0.5 | — |
| Benzoic acid diamines | Bis(4-amino-3-carboxyphenyl)methane | — | — |
| Phenyl ether diamines | 4,4'-diaminodiphenyl ether | 0.35 | — |
| Aminotetramethyldisiloxanes | 1,3-bis(3-aminopropyl)tetramethyldisiloxane | 0.1 | — |
| Phenolamines | 3-aminophenol | 0.1 | — |
| Evaluation results | Alkali dissolution rate (Å/s) | 563 | 1218 |
|  | Spacing (μm) | No gap with scum | Miscible with photoresist layer |

<Evaluation Methods>
a. Alkali Dissolution Rate

The initial film thickness ($T_1$, unit: μm) of the prepared photoresist film was measured. Next, the photoresist film was immersed in a developing solution (TMAH having a concentration of 2.38 wt %), and the change of the photoresist film was observed until the photoresist film completely disappeared. The time ($T_{time}$, in seconds) needed for the photoresist film to go from the initial film thickness to no film was recorded, and the alkali dissolution rate was calculated according to the following equation:

$$\text{Alkali dissolution rate (Å/s)} = \frac{T_1 * 10000}{T_{time}}$$

b. Spacing

The prepared laminate was measured for the spacing between the release layer and the photoresist layer generated by undercuts via a field emission scanning electron microscope (FESEM) (model: SU8010, manufactured by Hitachi, Ltd.) at a magnification of 1.5 k times.

<Evaluation Results>

As may be seen from Table 1, the laminates formed in Examples 1 to 3 including the release layer formed by the polyimide resin containing the benzoic acid diamines have good alkali dissolution rate and spacing, and therefore a photoresist layer or a composite photoresist having a special pattern may be formed, such that the photoresist layer or the composite photoresist may be removed well. In contrast, the laminate (Comparative example 1) formed by the release layer formed by the polyimide resin without the benzoic acid diamines has poor alkali dissolution rate and spacing.

In addition, compared with the laminates (Examples 1 to 3) formed by the release layer formed by the polyimide resin, the laminate (Comparative example 2) formed by the release layer formed by the phenolic resin has poor alkali dissolution rate and spacing.

In addition, compared with a laminate (Example 1) including the release layer formed by the polyimide resin without the phenyl ether diamines, the laminates (Examples 2 to 3) including the release layer formed by the polyimide resin containing the phenyl ether diamines have lower alkali dissolution rate and smaller spacing. Therefore, when the laminate includes the release layer formed by the polyimide resin containing the phenyl ether diamines, the patterning of the photoresist layer or the composite photoresist may not be significant, such that the photoresist layer or the composite photoresist is less readily removed and remains in a device using the release layer.

Based on the above, in the method of removing the photoresist of the invention, a photoresist layer is formed on a release layer and in contact with the release layer, wherein the release layer is formed by a polyimide resin, and the polyimide resin is obtained by the polymerization of tetracarboxylic dianhydrides, diamines, and phenolamines, wherein when the diamines include hydroxyfluorinated diamines, benzoic acid diamines, and aminotetramethyldisiloxanes, the laminate including the release layer formed by the polyimide resin has good alkali dissolution rate and spacing such that the photoresist layer or the composite photoresist may be removed well when the photoresist is removed or a metallic pattern is formed. Therefore, the laminate may be applied to the method of removing the photoresist or the method of forming the metallic pattern to improve the performance of a device using the release layer. In addition, when the stripper of the invention is a mixture of ethylene glycol and diethylene glycol monobutyl ether, the photoresist layer or the composite photoresist in the laminate may be removed well, and therefore may be applied to the method of removing the photoresist or the method of forming the metallic pattern.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A method of removing a photoresist, comprising:
    forming a release layer on a substrate, the release layer having a first surface and a second surface opposite to each other, wherein the first surface of the release layer is in contact with the substrate;
    forming a photoresist layer on the second surface of the release layer; and
    removing the release layer and the photoresist layer,
    wherein the release layer is formed by a polyimide resin, and the polyimide resin is obtained by performing a polymerization of tetracarboxylic dianhydrides, diamines, and phenolamines, wherein the tetracarboxylic dianhydrides comprise bicyclo[2.2.2]oct-7-ene-2,3,5,6-tetracarboxylic dianhydride, the diamines comprise 2,2-bis(3-amino-4-hydroxyphenyl)

hexafluoropropane, bis(4-amino-3-carboxyphenyl) methane, 1,3-bis(3-aminepropyl)tetramethyldisiloxane and 4,4'-diaminodiphenyl ether, the phenolamines comprise 3-aminophenol.

2. The method of removing the photoresist of claim 1, wherein a stripper for removing the release layer and the photoresist layer is a mixture of ethylene glycol and diethylene glycol monobutyl ether.

3. The method of removing the photoresist of claim 1, wherein the photoresist layer is a negative photoresist layer.

4. A laminate, comprising:
a substrate;
a release layer having a first surface and a second surface opposite to each other, wherein the first surface of the release layer is in contact with the substrate; and
a photoresist layer having a third surface and a fourth surface opposite to each other, wherein the third surface of the photoresist layer is in contact with the second surface of the release layer,
wherein there is a spacing between an edge of the third surface of the photoresist layer and an edge of the second surface of the release layer,
wherein the release layer is formed by a polyimide resin, and the polyimide resin is obtained by performing a polymerization of tetracarboxylic dianhydrides, diamines, and phenolamines, wherein the tetracarboxylic dianhydrides comprise bicyclo[2.2.2]oct-7-ene-2,3,5,6-tetracarboxylic dianhydride, the diamines comprise 2,2-bis(3-amino-4-hydroxyphenyl) hexafluoropropane, bis(4-amino-3-carboxyphenyl) methane, 1,3-bis(3-aminepropyl)tetramethyldisiloxane and 4,4'-diaminodiphenyl ether, the phenolamines comprise 3-aminophenol.

5. The laminate of claim 4, wherein the spacing is 1 μm to 35 μm.

6. The laminate of claim 4, wherein a cross-section of the photoresist layer along a direction of lamination of the substrate, the release layer, and the photoresist layer is an inverted cone.

7. The laminate of claim 4, wherein a thickness of the release layer is 0.1 μm to 10 μm.

8. The laminate of claim 4, wherein the release layer is formed by a polyimide resin, and the polyimide resin has a structure represented by Formula (2) or a structure represented by Formula (3),

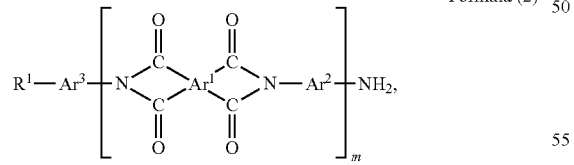

Formula (2)

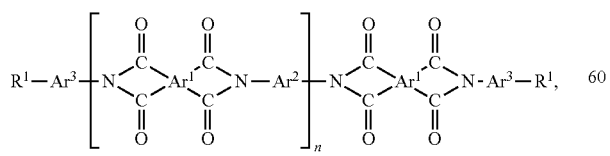

Formula (3)

in Formula (2) and Formula (3), m is an integer of 5 to 150, n is an integer of 5 to 150, $Ar^1$ is a tetravalent organic group, $Ar^2$ is a divalent organic group derived from the diamines, $Ar^3$ is a divalent aryl group, and $R^1$ is a hydroxyl group or a group.

9. The laminate of claim 8, wherein $Ar^1$ is

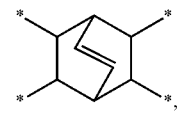

and * represents a bonding position.

10. The laminate of claim 8, wherein $Ar^2$ is

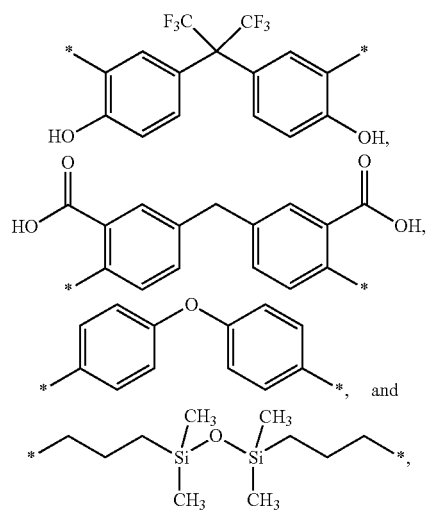

and * represents a bonding position.

11. The laminate of claim 8, wherein $Ar^3$ is a phenylene group.

12. The laminate of claim 8, wherein a weight-average molecular weight of the polyimide resin is 5000 to 50000.

13. The laminate of claim 4, wherein the photoresist layer is a negative photoresist layer.

14. A method of forming a metallic pattern, comprising:
forming a release layer on a substrate;
forming a photoresist layer on the release layer;
performing an exposure and development process on the release layer and the photoresist layer to form a composite photoresist on the substrate;
forming a metal layer on the composite photoresist and a portion of the substrate exposed by the composite photoresist; and
removing the composite photoresist and a portion of the metal layer located on the composite photoresist to form a metallic pattern on the substrate,
wherein the release layer is formed by a polyimide resin, and the polyimide resin is obtained by performing a polymerization of tetracarboxylic dianhydrides, diamines, and phenolamines, wherein the tetracarboxylic dianhydrides comprise bicyclo[2.2.2]oct-7-ene-2,3,5,6-tetracarboxylic dianhydride, the diamines comprise 2,2-bis(3-amino-4-hydroxyphenyl) hexafluoropropane, bis(4-amino-3-carboxyphenyl) methane, 1,3-bis(3-aminepropyl)tetramethyldisiloxane and 4,4'-diaminodiphenyl ether, the phenolamines comprise 3-aminophenol.

15. The method of forming the metallic pattern of claim 14, wherein a stripper for removing the composite photoresist is a mixture of ethylene glycol and diethylene glycol monobutyl ether.

16. The method of forming the metallic pattern of claim 14, wherein the photoresist layer is a negative photoresist layer.

17. A polyimide resin obtained by performing a polymerization of tetracarboxylic dianhydrides, diamines, and phenolamines, wherein the tetracarboxylic dianhydrides comprise bicyclo[2.2.2]oct-7-ene-2,3,5,6-tetracarboxylic dianhydride, the diamines comprise 2,2-bis(3-amino-4-hydroxyphenyl)hexafluoropropane, bis(4-amino-3-carboxyphenyl)methane, 1,3-bis(3-aminepropyl)tetramethyldisiloxane and 4,4'-diaminodiphenyl ether, the phenolamines comprise 3-aminophenol.

18. A polyimide resin having a structure represented by Formula (2) or a structure represented by Formula (3),

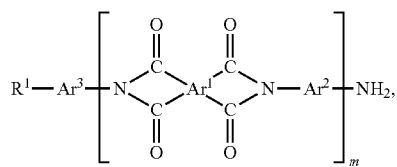

Formula (2)

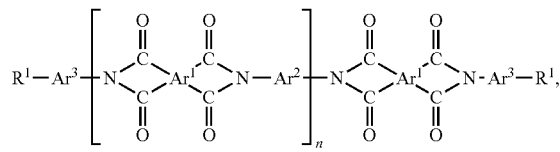

Formula (3)

in Formula (2) and Formula (3), m is an integer of 5 to 150, n is an integer of 5 to 150, $Ar^1$ is

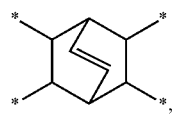

$Ar^2$ is a divalent organic group, * represents a bonding position, $Ar^3$ is a phenylene group, and $R^1$ is a hydroxyl group or a carboxyl group, wherein the divalent organic group of $Ar^2$ is derived from diamines, and the diamines comprise 2,2-bis(3-amino-4-hydroxyphenyl)hexafluoropropane, bis(4-amino-3-carboxyphenyl)methane, 1,3-bis(3-aminepropyl)tetramethyldisiloxane and 4,4'-diaminodiphenyl ether.

19. The polyimide resin of claim 18, wherein a weight-average molecular weight of the polyimide resin is 5000 to 50000.

* * * * *